(12) United States Patent
Park et al.

(10) Patent No.: US 10,647,066 B2
(45) Date of Patent: May 12, 2020

(54) MANUFACTURING APPARATUS OF FLEXIBLE DISPLAY DEVICE AND MANUFACTURING METHOD USING THE SAME

(71) Applicant: Samsung Display Co., Ltd., Yongin-si (KR)

(72) Inventors: Cheul Jin Park, Seoul (KR); Da Woon Kim, Yongin-si (KR); Jong Deok Park, Seoul (KR); Suk Won Jung, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/260,109

(22) Filed: Jan. 29, 2019

(65) Prior Publication Data

US 2019/0315072 A1 Oct. 17, 2019

(30) Foreign Application Priority Data

Apr. 12, 2018 (KR) .................. 10-2018-0042877

(51) Int. Cl.
*B29C 65/00* (2006.01)
*G06F 1/16* (2006.01)
*G09F 9/30* (2006.01)
*B30B 3/00* (2006.01)

(52) U.S. Cl.
CPC ............ *B29C 66/8145* (2013.01); *B30B 3/00* (2013.01); *G06F 1/1652* (2013.01); *G09F 9/301* (2013.01)

(58) Field of Classification Search
CPC . G06F 1/1652; G06F 1/1601; B29C 66/8145; B30B 3/00; G09F 9/301
See application file for complete search history.

(56) References Cited

U.S. PATENT DOCUMENTS

| | | | |
|---|---|---|---|
| 9,498,938 B2 | 11/2016 | Son et al. | |
| 10,005,124 B2 | 6/2018 | Lee et al. | |
| 10,105,943 B2 | 10/2018 | Kim et al. | |
| 2005/0088812 A1* | 4/2005 | Hillman | F16M 11/10 |
| | | | 361/679.07 |
| 2017/0050424 A1 | 2/2017 | Son et al. | |
| 2017/0068277 A1* | 3/2017 | Cohen | G06F 1/1652 |
| 2017/0199548 A1 | 7/2017 | Kim et al. | |

FOREIGN PATENT DOCUMENTS

| | | |
|---|---|---|
| JP | 2000-210360 | 8/2000 |
| KR | 10-1701247 | 2/2017 |
| KR | 10-2017-0023267 | 3/2017 |
| KR | 10-1713400 | 3/2017 |
| KR | 10-2017-0084414 | 7/2017 |
| KR | 10-1788198 | 10/2017 |

* cited by examiner

*Primary Examiner* — Kevin Quarterman
(74) *Attorney, Agent, or Firm* — H.C. Park & Associates, PLC (57) ABSTRACT

A manufacturing apparatus of a flexible display device, including: a main chamber in which a display device is mounted; an auxiliary chamber configured to inject a first pressing material having fluidity into the main chamber; and a driving portion configured to rotate the main chamber.

20 Claims, 9 Drawing Sheets

MANUFACTURING APPARATUS OF FLEXIBLE DISPLAY DEVICE AND MANUFACTURING METHOD USING THE SAME

CROSS-REFERENCE TO RELATED APPLICATION

This application claims priority from and the benefit of Korean Patent Application No. 10-2018-0042877, filed on Apr. 12, 2018, which is hereby incorporated by reference for all purposes as if fully set forth herein.

BACKGROUND

Field

Exemplary embodiments of the invention relate generally to a manufacturing apparatus of a flexible display device and a manufacturing method using the same.

Discussion of the Background

A flexible display device having light weight, strong impact resistance, and a flexible substrate has been developed.

The flexible display device includes display elements formed on a flexible substrate. Display elements that may be used for the flexible display device include an organic light emitting diode display element, a liquid crystal display element, and an electrophoretic display (EPD) element.

Generally, the flexible display device is manufactured by attaching a window for protecting a display panel to the above-mentioned display element.

The above information disclosed in this Background section is only for understanding of the background of the inventive concepts, and, therefore, it may contain information that does not constitute prior art.

SUMMARY

Exemplary embodiments of the present invention provide a manufacturing apparatus of a flexible display device and a manufacturing method using the same that may closely attach a display panel and a window to prevent air bubbles from occurring between the display panel and the window during a manufacturing process of a flexible display device.

Additional features of the inventive concepts will be set forth in the description which follows, and in part will be apparent from the description, or may be learned by practice of the inventive concepts.

An exemplary embodiment of the present invention provides a manufacturing apparatus of a flexible display device, including: a main chamber configured to mount a display device; an auxiliary chamber configured to inject a first pressing material having fluidity into the main chamber; and a driving portion configured to rotate the main chamber.

The first pressing material may include at least one of a liquid and a metal ball.

The first pressing material may include the liquid and the metal ball, a specific gravity of the liquid may be 0.8 to 1.0, and a specific gravity of the metal ball may be equal to or greater than 2.5.

The liquid may include at least one of mercury, a lubricating oil, and water.

The driving portion may rotate the main chamber at a first speed or a second speed.

The second speed may be greater than the first speed.

When the main chamber rotates at the first speed, the first pressing material may be positioned at a central portion of the main chamber, and when the main chamber rotates at the second speed, the first pressing material may be positioned at a peripheral portion of the main chamber.

The manufacturing apparatus of the flexible display device may further include: an inlet configured to inject the first pressing material into the main chamber; and an outlet configured to remove the first pressing material from the main chamber.

The manufacturing apparatus of the flexible display device may further include a pressing member configured to applying pressure to a space in the main chamber.

The manufacturing apparatus of the flexible display device may include a plurality of main chambers.

Another exemplary embodiment of the present invention provides a method of manufacturing a flexible display device, including: mounting a display panel and a window in a main chamber in a provisionally combined state; injecting a first pressing material having fluidity into the main chamber; rotating the main chamber at a first speed; and rotating the main chamber at a second speed.

The first speed may be slower than the second speed.

Each of the display panel and the window may include a flat portion and a lateral portion forming a predetermined angle with the flat portion.

In the rotating of the main chamber at the first speed, the first pressing material may overlap the flat portion of the display panel and the flat portion of the window.

In the rotating of the main chamber at the second speed, the first pressing material may be positioned to be adjacent to the respective lateral portions.

The first pressing material may move from a central portion of the display panel and window to a peripheral portion thereof.

The manufacturing apparatus of the flexible display device may further include, after the first pressing material is mounted, applying pressure to the inside of the main chamber.

The manufacturing apparatus of the flexible display device may further include removing the first pressing material from the main chamber.

Yet another exemplary embodiment of the present invention provides a manufacturing apparatus of a flexible display device, including: mounting a display panel and a window in a main chamber in a provisionally combined state; injecting a first pressing material having fluidity into the main chamber; and rotating the main chamber at a first speed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Further, throughout the specification, the phrase "in a plan view" means viewing a target portion from the top, and the phrase "in a cross-sectional view" means viewing a cross-section formed by vertically cutting a target portion from the side.

Figure 1:
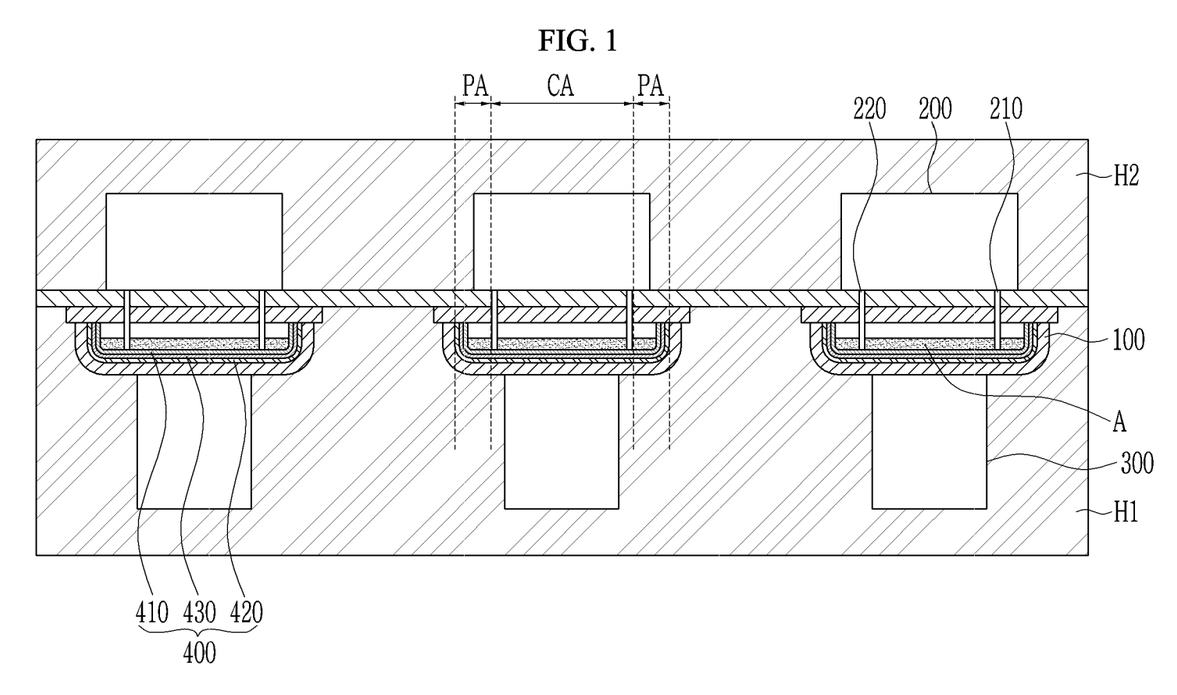
FIG. 1 is a cross-sectional view of a manufacturing apparatus of a flexible display device according to an exemplary embodiment.

Hereinafter, a manufacturing apparatus of a flexible display device according to an exemplary embodiment will be described with reference to FIG. 1. FIG. 1 illustrates a cross-sectional view of a manufacturing apparatus of a flexible display device according to an exemplary embodiment.

Referring to FIG. 1, a manufacturing apparatus of a flexible display device according to an exemplary embodiment may include a main chamber 100, an auxiliary chamber 200 for injecting a first pressing material into the main chamber 100, and a driving portion 300 for rotating the main chamber 100.

According to the exemplary embodiment, the manufacturing apparatus of the flexible display device may include a plurality of the main chambers 100 mounted on a lower housing H1 and a plurality of the auxiliary chambers 200 mounted on an upper housing H2. However, the present invention is not limited thereto, and the manufacturing apparatus of the flexible display device may include one main chamber 100 and one auxiliary chamber 200 connected thereto. In addition, a structure in which one auxiliary chamber 200 is connected to a plurality of the main chambers 100 may be possible, and the present invention is not limited to the number of main chambers 100 and auxiliary chambers 200. Hereinafter, the main chamber 100 and the auxiliary chamber 200 will be described, respectively.

The main chamber 100 is a space in which a display device 400 of a provisionally combined state is mounted. An inner surface of the main chamber 100 may have the same shape as a curved shape of the display device 400.

The display device 400 of the provisionally combined state includes a display panel 410, a window 420, and an adhesive layer 430 disposed between the display panel 410 and the window 420. Although the adhesive layer 430 is disposed between the display panel 410 and the window 420, they are not in a state of being completely coupled.

The auxiliary chamber 200 is a space capable of mounting the first pressing material. The auxiliary chamber 200 may be connected to the main chamber 100 to inject the first pressing material into the main chamber 100 in which the display device 400 is mounted or to recover the first pressing material after a coupling process is completed.

In the exemplary embodiment, the auxiliary chamber 200 may include an inlet 210 for injecting the first pressurized material into the main chamber 100 and an outlet 220 for recovering the first pressing material.

In the present specification, it is exemplarily described that the inlet 210 and the outlet 220 are separately formed, but the present invention is not limited thereto, and the inlet 210 and the outlet 220 may be formed as one passage.

The first pressing material (A) injected into the main chamber 100 may have fluidity. The first pressing material (A) may include at least one of a liquid and a metal ball.

In the exemplary embodiment, the first pressing material (A) may have a mixed form of the liquid and the metal ball. The first pressing material (A) includes the liquid and the metal ball, wherein the liquid may have a specific gravity of about 0.8 to 1.0, and the metal ball may have a specific gravity of about 2.5 or more. The first pressing material (A) including the liquid and the metal ball satisfying the specific gravity as described above may apply an appropriate pressure to the adhesive layer 430 for combining the display panel 410 and the window 420.

In addition, the liquid according to the exemplary embodiment may include at least one of mercury, a lubricating oil, and water, but the liquid is not limited to those described above. When the liquid according to the exemplary embodiment includes the mercury, the first pressing material (A) may not include the metal ball because it is possible to provide sufficient pressure with the mercury. When the liquid according to the exemplary embodiment includes the lubricating oil or water, the first pressing material (A) may further include the metal ball. This is to apply sufficient pressure to the adhesive layer 430 that combines the display panel 410 and the window 420.

The driving portion 300 may be connected to the main chamber 100 to rotate the main chamber 100 in one direction. The driving portion 300 may use any element for rotating the main chamber 100, and for example, it may include a motor.

In the present specification, it is exemplarily illustrated that each driving portion 300 is connected to each main chamber 100, but the present invention is not limited thereto, and an exemplary embodiment in which one driving portion 300 is connected to a plurality of the main chambers 100 is possible.

The driving portion 300 may rotate the main chamber 100 at a first speed or may rotate the main chamber 100 at a second speed. The first speed is different from the second speed, and the second speed may be faster than the first speed.

When the main chamber 100 is rotated at the first speed, the first pressing material (A) injected into the main chamber 100 may be positioned to overlap a central portion CA of the main chamber 100. Alternatively, the first pressing material (A) may be evenly spread on all of a lower surface of the main chamber 100 corresponding to the central portion CA and a peripheral portion PA thereof. In the present specification, an area including a flat lower surface around a center axis in the main chamber 100 is referred to as the central portion CA and a periphery of the central portion CA is referred to as the peripheral portion PA.

When the main chamber 100 is rotated at the second speed, the first pressing material (A) injected into the main chamber 100 may be positioned to overlap the peripheral portion PA of the main chamber 100. Particularly, it may overlap a lateral portion of the display device 400 positioned at the peripheral portion PA.

In the present specification, a state in which the first pressing material (A) is positioned at the peripheral portion PA of the main chamber 100 means that the first pressing material (A) is not positioned in the central portion CA at all but most of the first pressing material (A) is positioned in the peripheral portion PA, and that a portion of the first pressing material (A) may overlap the central portion CA. However, even in this case, the first pressing material (A) may not nearly be positioned to be adjacent to a central axis of the main chamber 100.

The manufacturing apparatus of the flexible display device according to the exemplary embodiment may further include a pressing member (not shown).

The pressing member may apply pressure to a lower surface of the main chamber 100 in a state in which the first pressing material (A) is injected into the main chamber 100. The pressing member may include any element for applying pressure into the main chamber 100, and in order to increase pressure in an inner space of the main chamber 100, any element for injecting gas thereinto or physically reducing a volume of the inner space thereof may be possible.

The manufacturing apparatus of the flexible display device according to the exemplary embodiment may not only apply a predetermined pressure to the adhesive layer between the display panel and the window by the specific gravity of the first pressing material itself, but may also easily combine the display panel and the lateral surface of the window with centrifugal force of the first pressing material caused by rotation of the main chamber.

Figure 2:
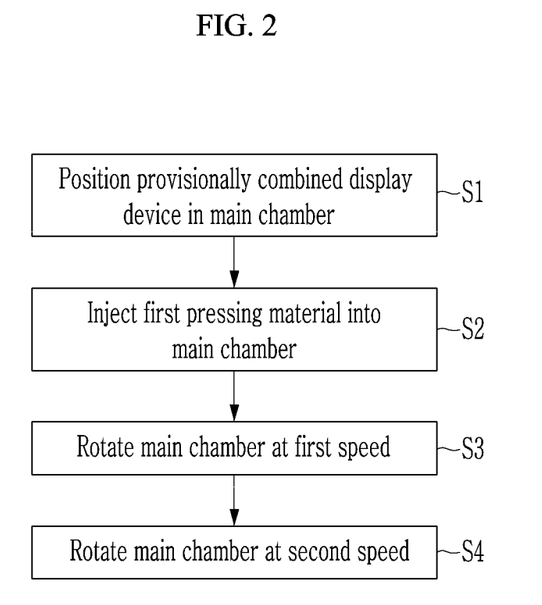
FIG. 2 is a flowchart of a method of manufacturing a flexible display device according to an exemplary embodiment.

Hereinafter, a method of manufacturing a flexible display device will be described with reference to FIG. 2 to FIG. 6. FIG. 2 illustrates a flowchart of a method of manufacturing a flexible display device according to an exemplary embodiment, and FIG. 3, FIG. 4, FIG. 5, and FIG. 6 illustrate cross-sectional views of a manufacturing apparatus of a flexible display device according to the method of manufacturing the exemplary embodiment, respectively.

Figure 3:
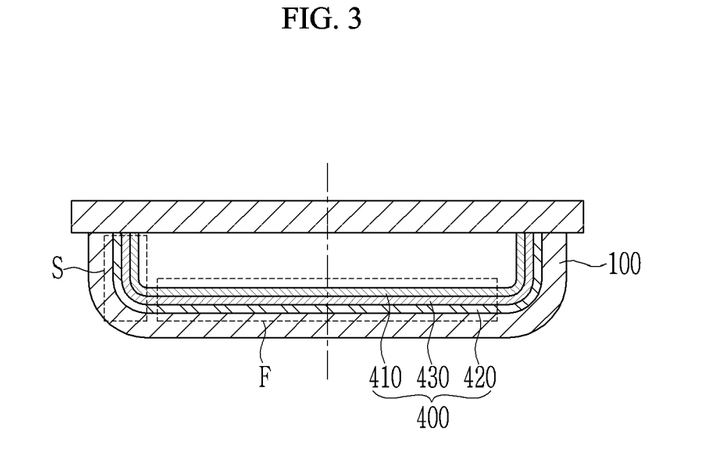
FIG. 3, FIG. 4, FIG. 5, and FIG. 6 are cross-sectional views of a manufacturing apparatus of a flexible display device according to the method of manufacturing of the exemplary embodiment.

Referring to FIG. 2 and FIG. 3, the provisionally combined display device 400 is positioned in the main chamber 100 (S1). The provisionally combined display device 400 includes the display panel 410, the window 420 overlapping the display panel 410, and the adhesive layer 430 disposed between the display panel 410 and the window 420. The provisionally combined state means a state in which the display panel 410 and the window 420 are not completely combined by the adhesive layer 430.

The display device 400 of the provisionally combined state includes a flat portion F and a lateral portion S connected to the flat portion F. The flat portion F and the lateral portion S may form a predetermined angle, and may have the same shape as the inside of the main chamber 100.

Figure 4:
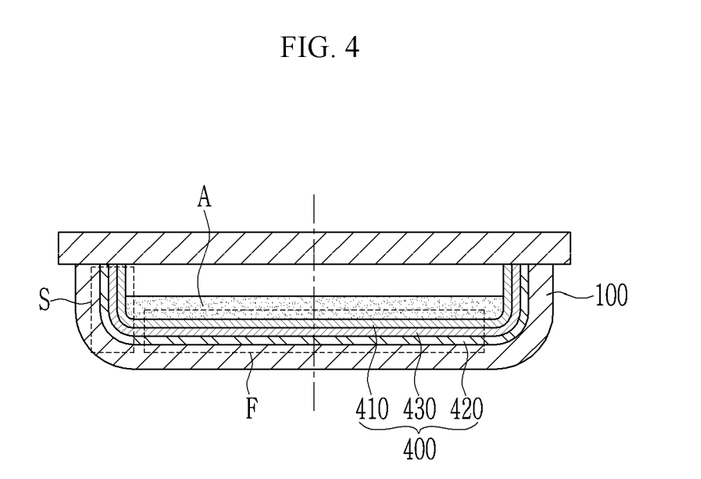

Referring to FIG. 2 and FIG. 4, the first pressing material (A) is injected into the main chamber 100 (S2). For example, the first pressing material (A) may be injected into the main chamber 100 through an inlet or the like while being mounted on an auxiliary chamber (not shown).

The injected first pressing material (A) may be positioned on a back surface of the display device 400 positioned in the main chamber 100, particularly, on a back surface of the display panel 410.

Figure 5:
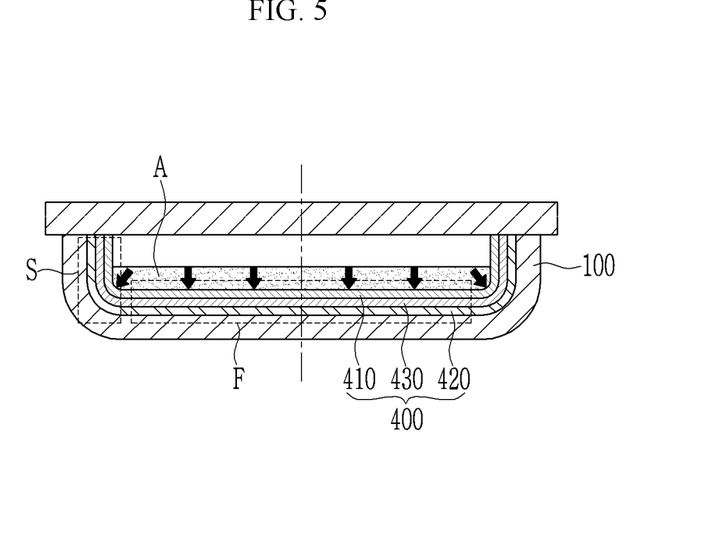

Referring to FIG. 2 and FIG. 5, the driving portion (not shown) may rotate the main chamber 100 at the first speed (S3). In this case, the first pressing material (A) injected into the main chamber 100 may be evenly spread over the display device 400, as shown in FIG. 5. As the first pressing material (A) rotates, force applied to the display device 400 by the first pressing material (A) may be transmitted to the flat portion F of the display device 400. Particularly, the first pressing material (A) may transmit the force in a direction away from a center of the display device 400.

The display panel 410 and the window 420 that are provisionally combined may be substantially combined from the center thereof by the force applied to the display device 400 due to the specific gravity of the first pressing material (A) and the force applied to the display device 400 as the first pressing material (A) rotates at a predetermined speed.

Figure 6:
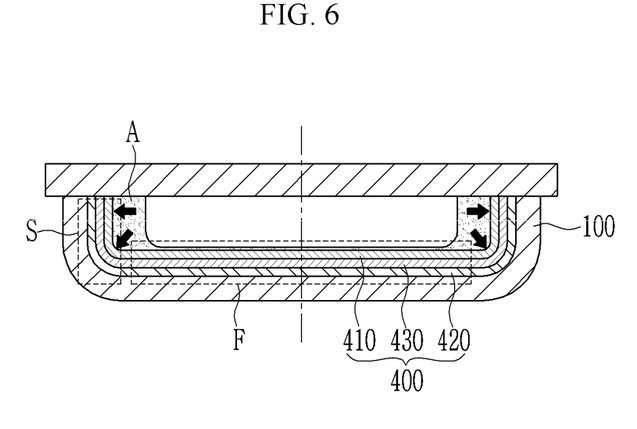

Referring to FIG. 2 and FIG. 6, the driving portion (not shown) rotates the main chamber 100 at the second speed (S4). The second speed may be greater than the first speed. The first speed and the second speed may be selected during the manufacturing process in consideration of the specific gravity of the first pressing material, a material of the adhesive layer, a size of the display device, and the like.

The first pressing material (A) in the main chamber 100 rotating at the second speed may be positioned to be adjacent to the lateral portion of the display device 400, as shown in FIG. 6. The first pressing material (A) may receive the centrifugal force due to the rotation of the main chamber 100. Thus, the first pressing material (A) may move to the lateral surfaces of the main chamber 100 and the display device 400. The force applied by the first pressing material (A) may be concentrated on the lateral portion of the display device 400, and thus, the display panel 410 and the window 420 may be easily combined to the lateral portion.

As the main chamber 100 is rotated from the first speed to the second speed, the first pressing material (A) may move from the center of the main chamber 100 toward the periphery thereof. The force due to the specific gravity of the first pressing material (A) may move from the flat portion F of the display device 400 toward the lateral portion S. Accordingly, the display panel 410 and the window 420 may be combined with each other regardless of the shape of the display device 400, and it is possible to easily discharge the bubbles between the display panel 410 and the window 420 to the outside of the display device 400.

The display panel 410 and the window 420 according to this exemplary embodiment are combined by combination of the force due to the specific gravity of the first pressing material having fluidity and the force applied to the display device 400 by the centrifugal force of the first pressing material.

In an exemplary embodiment, after the first pressing material is injected, the main chamber 100 is rotated at the first speed (Step 1), and then the main chamber 100 is rotated at the second speed (Step 2), but is the inventive concepts are not limited thereto, and one of two steps may be selectively omitted.

In the process of combining the display panel 410 and the window 420, when it is necessary for the flat portion F of the display device 400 to be combined, the flat portion F of the display panel 410 and the flat portions F of the window 420 may be combined by rotating the main chamber 100 at the first speed. In addition, when it is necessary for the lateral portion S to be combined, a manufacturing process of combining the lateral portion S of the display panel 410 and the lateral portion S of the window 420 by rotating the main chamber 100 at the second speed may be possible.

Figure 7:
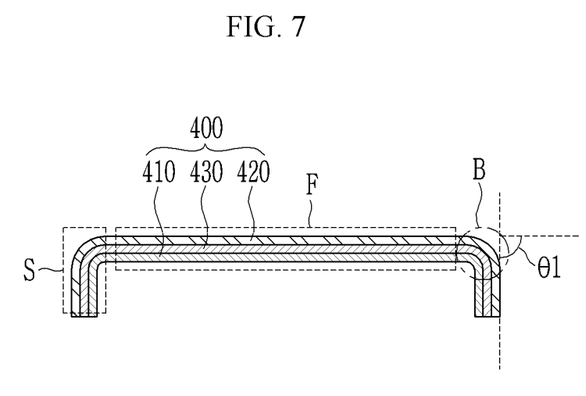
FIG. 7 and FIG. 8 are cross-sectional views of a flexible display device manufactured according to an exemplary embodiment.
Figure 8:
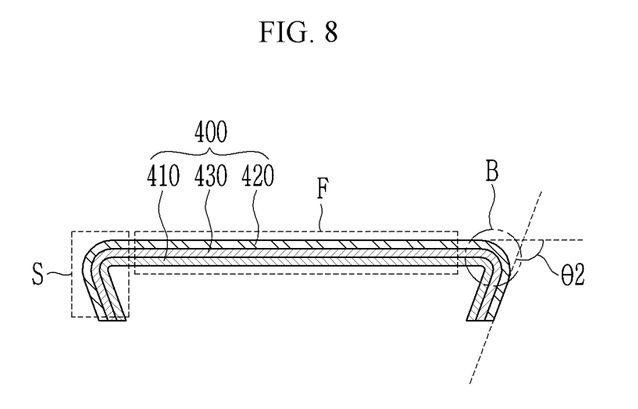

Hereinafter, a flexible display device manufactured by the manufacturing apparatus of the flexible display device according to the exemplary embodiment will be described with reference to FIG. 7 and FIG. 8. FIG. 7 and FIG. 8 illustrate cross-sectional views of a flexible display device according to an exemplary embodiment.

A flexible display device 400 according to this exemplary embodiment 400 may have a structure as shown in FIG. 7 and FIG. 8.

For example, as shown in FIG. 7, an angle θ1 formed by an imaginary line extending from the flat portion F of the display device 400 and the lateral portion S may be 30 to 90 degrees. In addition, as shown in FIG. 8, an angle θ2 formed by the imaginary line extending from the flat portion F of the display device 400 and the lateral portion S may be 90 degrees or more, and for example, may be about 120 degrees.

As shown in FIG. 7 and FIG. 8, in the manufacturing process of the display device, it is not easy to combine the display panel 410 and the window 420 in a bending region B as the angle between the imaginary line extending from the flat portion F and the lateral portion S increases. It is difficult to combine the display panel 410 and the window 420 with each other, and a bubble or the like may remain between the display panel 410 and the window 420 to cause defects.

However, according to an exemplary embodiment of the inventive concepts, since the display panel 410 and the window 420 are combined by using the first pressing material having fluidity, they may be easily combined even in the bending region B regardless of the shape of the display device 400. In addition, since the force applied to the display device 400 by the first pressing material is applied from the flat portion F to the lateral portion S through the rotation speed adjustment, the bubbles may be removed from the center toward the peripheral portion. According to this exemplary embodiment, it is possible to provide a flexible display device in which a combination process is easily performed and bubbles are removed to improve reliability.

FIG. 7 and FIG. 8 illustrates one cross-section of the display device, respectively, and the display device according to the exemplary embodiment may include the lateral portion forming the angles with two corners of the flat portion, or may include the lateral portions forming the angles with four corners of the flat portion, but the inventive concepts are not limited thereto.

Figure 9:
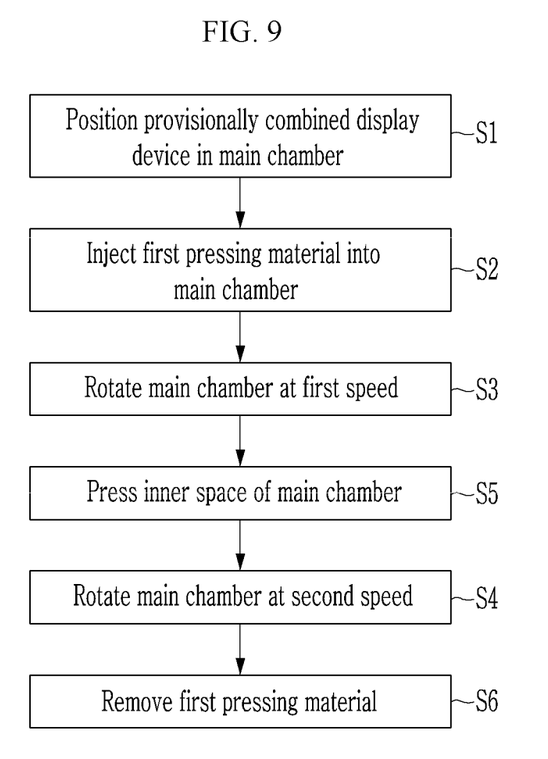
FIG. 9 is a flowchart of a method of manufacturing method a flexible display device according to an exemplary embodiment.

A method of manufacturing the flexible display device according to an exemplary embodiment will now be described with reference to FIG. 9. FIG. 9 illustrates a flowchart of a method of manufacturing a flexible display device according to an exemplary embodiment. Descriptions of the same constituent elements as those described with reference to FIG. 2 will be omitted.

Referring to FIG. 9, the method of manufacturing the flexible display device according to this exemplary embodiment may further include pressing an inner space of the main chamber 100 (S5), which is performed after injecting the first pressing material into the main chamber 100 and then rotating the main chamber 100 at the first speed.

A force of the pressing of the inner space of the main chamber 100 may be added to the force applied to the adhesive layer by the specific gravity of the first pressing material and the centrifugal force of the first pressing material. The force applied to the adhesive layer 430 disposed between the display panel 410 and the window 420 may be controlled according to the force by the pressing. Thus, it may be easier to combine the flat portion F of the display device.

In an exemplary embodiment, the inner space of the main chamber 100 is pressed after the main chamber 100 is rotated at the first speed, but the inventive concepts are not limited thereto, and it is possible to inject the first pressing material and press the inner space of the main chamber 100, and then rotate the main chamber 100. However, is the inventive concepts are not limited to the order.

In addition, another exemplary embodiment may include removing the first pressing material from the main chamber 100 (S6) after combining the display panel 410 and the window 420. The first pressing material may be removed by various means, and for example, the first pressing material may be removed through a suction portion (not shown) connected to the outlet. However, the inventive concepts are not limited thereto.

In the prior art, a flexible display device may be manufactured by attaching a window to an upper jig, attaching a display panel and an adhesive layer to a lower jig, and then combining the upper jig and the lower jig. However, when the flexible display device is manufactured by such a method, an angle formed by the flat portion and the lateral portion of the display device may be limited. As the angle between the imaginary line extending from the flat portion and the lateral portion increases, it becomes difficult to combine the display panel and the window in the above-described method.

According to an exemplary embodiment of the present invention, it is possible to bond or combine the display panel and the window without limitation of the angle between the flat portion and the lateral portion of the display device. In addition, the adhesive layer between the display panel and the window can be uniformly applied, and bubbles do not occur in the adhesive layer, so that precise combination may be realized. Further, it is possible to prevent occurrence of cracks in the display device due to excessive combining by sequentially applying force between the display panel and the window, thereby improving reliability of the display device by uniformly bonding the display panel and the window.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A manufacturing apparatus of a flexible display device, comprising:
   a main chamber configured to mount a display device;
   an auxiliary chamber configured to inject a first pressing material having fluidity into the main chamber; and
   a driving portion configured to rotate the main chamber.

2. The manufacturing apparatus of the flexible display device of claim 1, wherein
   the first pressing material comprises at least one of a liquid and a metal ball.

3. The manufacturing apparatus of the flexible display device of claim 2, wherein:
   the first pressing material comprises the liquid and the metal ball;
   a specific gravity of the liquid is 0.8 to 1.0; and
   a specific gravity of the metal ball is equal to or greater than 2.5.

4. The manufacturing apparatus of the flexible display device of claim 2, wherein
   the liquid comprises at least one of mercury, a lubricating oil, and water.

5. The manufacturing apparatus of the flexible display device of claim 1, wherein the driving portion is configured to rotate the main chamber at a first speed or a second speed.

6. The manufacturing apparatus of the flexible display device of claim 5, wherein
   the second speed is greater than the first speed.

7. The manufacturing apparatus of the flexible display device of claim 5, wherein:

when the main chamber rotates at the first speed, the first pressing material is positioned at a central portion of the main chamber; and when the main chamber rotates at the second speed, the first pressing material is positioned at a peripheral portion of the main chamber.

8. The manufacturing apparatus of the flexible display device of claim 1, further comprising:

an inlet configured to inject the first pressing material into the main chamber; and an outlet configured to remove the first pressing material from the main chamber.

9. The manufacturing apparatus of the flexible display device of claim 1, wherein the manufacturing apparatus of the flexible display device comprises a plurality of main chambers.

10. A method of manufacturing a flexible display device, comprising:

mounting a display panel and a window in a main chamber in a provisionally combined state;

injecting a first pressing material having fluidity into the main chamber;

rotating the main chamber at a first speed; and rotating the main chamber at a second speed.

11. The method of claim 10, wherein the first pressing material includes the liquid and the metal ball, a specific gravity of the liquid is 0.8 to 1.0, and a specific gravity of the metal ball is equal to or greater than 2.5.

12. The method of claim 10, wherein the first speed is slower than the second speed.

13. The method of claim 10, wherein each of the display panel and the window comprises:

a flat portion; and a lateral portion forming a predetermined angle with the flat portion.

14. The method of claim 13, wherein, in the rotating of the main chamber at the first speed, the first pressing material overlaps the flat portion of the display panel and the flat portion of the window.

15. The method of claim 13, wherein, in the rotating of the main chamber at the second speed, the first pressing material is positioned to be adjacent to the respective lateral portions.

16. The method of claim 10, wherein the first pressing material moves from the flat portions of the display panel and the window to the lateral portions thereof.

17. The method of claim 10, further comprising, after the first pressing material is mounted, applying pressure to the inside of the main chamber.

18. The method of claim 10, further comprising removing the first pressing material from the main chamber.

19. A method of manufacturing a flexible display device, comprising:

mounting a display panel and a window in a main chamber in a provisionally combined state;

injecting a first pressing material having fluidity into the main chamber; and rotating the main chamber at a first speed.

20. The method of claim 19, wherein the first pressing material comprises at least one of a liquid and a metal ball.

* * * * *